United States Patent
Forghani-Zadeh et al.

(10) Patent No.: US 8,593,211 B2
(45) Date of Patent: Nov. 26, 2013

(54) SYSTEM AND APPARATUS FOR DRIVER CIRCUIT FOR PROTECTION OF GATES OF GAN FETS

(75) Inventors: Hassan Pooya Forghani-Zadeh, Allen, TX (US); Luis A. Huertas-Sanchez, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/422,132

(22) Filed: Mar. 16, 2012

(65) Prior Publication Data
US 2013/0241621 A1  Sep. 19, 2013

(51) Int. Cl.
*H03K 17/687* (2006.01)

(52) U.S. Cl.
USPC .......................... 327/427; 327/589; 327/108

(58) Field of Classification Search
None
See application file for complete search history.

(56) References Cited

U.S. PATENT DOCUMENTS

| | | | | |
|---|---|---|---|---|
| RE33,378 E | * | 10/1990 | Mehl | 327/109 |
| 5,138,200 A | * | 8/1992 | Barsanti et al. | 326/88 |
| 5,168,175 A | * | 12/1992 | Endo | 327/430 |
| 5,742,196 A | * | 4/1998 | Fronen et al. | 327/382 |
| 7,126,388 B2 | * | 10/2006 | Harriman | 327/108 |
| 7,129,766 B2 | * | 10/2006 | Steinhagen | 327/427 |
| 7,518,352 B2 | * | 4/2009 | De Lima Filho et al. | 323/288 |
| 7,741,901 B2 | * | 6/2010 | Lu et al. | 327/589 |
| 2008/0258808 A1 | * | 10/2008 | Locatelli et al. | 327/589 |
| 2009/0167410 A1 | * | 7/2009 | Yoshikawa et al. | 327/427 |
| 2010/0271079 A1 | * | 10/2010 | Choi et al. | 327/108 |

OTHER PUBLICATIONS

LM5113, "5A, 100V Half-Bridge Gate Driver for Enhancement Mode GaN FETs", Oct. 17, 2011, 2011 National Semiconductor Corporation, www.national.com, pp. 1-14.
Karl Richard Heck, U.S. Appl. No. 12/987,019, filed Jan. 7, 2011, entitled "High-Voltage Gate Driver that Drives Group III-N High Electron Mobility Transistors".
http://en.wikipedia.org/wiki/Three_State_Logic, Feb. 29, 2012, pp. 1-3.
Fundamentals of Gallium Nitride Power Transistors, EPC-Efficient Power Conversion Corporation, www.epc-co.com, Copyright 2011, pp. 1-4.
http://en.wikipedia.org/wiki/Bootstrapping_(electronics), Feb. 29, 2012, pp. 1-3.

(Continued)

*Primary Examiner* — Tuan T Lam
(74) *Attorney, Agent, or Firm* — Alan A. R. Cooper; W. James Brady, III; Frederick J. Telecky, Jr.

(57) ABSTRACT

A half-bridge power circuit comprises a first gallium nitride field effect transistor (GaN FET); a first driver coupled to a gate of the first GaN FET; an anode of a capacitor coupled to an output of the driver and a source of the first GaN FET; a diode having a cathode coupled to the cathode of the capacitor; and a bootstrap capacitor clamp (BCC) controller, including: a field effect transistor (FET) coupled to an anode of the diode, and a comparator coupled to a gate of the FET, the comparator configured to receive as inputs: a) a signal representative of an input voltage (VDRV) applied to the FET; b) a ground; c) a boot signal representative of a voltage at the anode of the capacitor (Boot); and d) a signal representative of a voltage at the source of the first GaN FET (SW).

23 Claims, 5 Drawing Sheets

(56) References Cited

OTHER PUBLICATIONS

Application Note AN-6076—Design and Application Guide of Bootstrap Circuit for High-Voltage Gate-Drive IC, www.fairchildsemi.com, 2008 Fairchild Semiconductor Corporation, pp. 1-13.

Masahito Kanamura et al., Enhancement-Mode GaN MIS-HEMTs With n-GaN/i-AIN/n-GaN Triple Cap Layer and High-k Gate Dielectrics, IEEE Electron Device Letters, vol. 31, No. 3, Mar. 2010, pp. 189-191.

* cited by examiner

SYSTEM AND APPARATUS FOR DRIVER CIRCUIT FOR PROTECTION OF GATES OF GAN FETS

TECHNICAL FIELD

This Application is directed, in general, to a voltage clamping circuit and, more specifically, to a voltage clamping circuit for a Gallium Nitride Field Effect Transistor (GaN FET).

BACKGROUND

Generally, Gallium Nitride technologies are enabling fabrication of power field effect transistors (FETs) with lower gate capacitance ($C_g$) and gate charge ($Q_g$), compared to state-of-the-art silicon FETS, such as metal oxide semiconductor FETs (MOSFETs) for a same resistance of a FET in saturation ($rds_{on}$).

Currently Gallium Nitride FETs (GaN FETs) can be four to five times better than a MOSFET (i.e. these various values are ¼ to ⅕ that of silicon FETs), and it is believed than GaN FETS can be potentially 100s of times better than MOSFETs. This means that GaN FETs can be switched at a much higher switching frequency with an equivalent power loss. Equivalently, it means that GaN FETs can aid in reaching a higher efficiency in a power circuit, if the GaN FETs are used instead of MOSFETs without a change in operation frequency.

While GaN FETs have been available for some time, a recent breakthrough in their manufacturing in 2010 has resulted in GaN FETs implemented on silicon substrates, which has caused industry to believe that GaN FETs can be adopted instead of MOSFETs in at least a fraction of uses in the next few years.

For more information regarding GaN FETs, please see "Application Note: Fundamentals of Gallium Nitride Power Transistors" by Stephen L. Colino, et al, Efficient Power Conversion Corporation, Copyright 2011, which is hereby incorporated by reference in its entirety. Also, please see "Enhancement-Mode GaN MIS-HEMTs With n-GaN/i-AlN/n-GaN Triple Cap Layer and High-k Gate Dielectrics", by M. Kanamura, et al, IEEE Electron Device Letters, Vol. 31. No. 3, March 2010, pages 189-191, which is also incorporated by reference in its entirety.

However, there are drawbacks associated with GaN FETs. Although GaN FETs have higher performance than silicon MOSFETs, they are also more sensitive and demanding in their usage requirements. One example of this sensitivity is that of the GaN FETs' gate and source (Vgs) sensitivity to voltage excursions. For example, efficient power conversion (EPC) enhancement-mode GaN FETs typically require a 5 Volt drive signal to achieve saturation, but the drive Voltage should not exceed 6 Volts under any condition, since it will cause a "soft damage" (increase of $rds_{on}$) of the GaN FET. To make matters, worse, unlike silicon MOSFETs, GaN FETs do not have a body diode, and, therefore, when the GaN FETs are off, if $V_{ds}$ goes negative, a GaN FET turns on at −3 Volts or −4 Volts difference between drain and source, instead of a body diode drop voltage as would occur in the case of a MOSFET.

Therefore, there is a need in the art to address at least some of the issues associated with GaN FETs.

SUMMARY

A first aspect provides an apparatus, comprising: a first gallium nitride field effect transistor (GaN FET); a first driver coupled to a gate of the first GaN FET; an anode of a capacitor coupled to an output of the driver and a source of the GAN; a diode having a cathode coupled to the cathode of the capacitor. The first aspect further provides a bootstrap capacitor clamp (BCC) controller, including: a field effect transistor (FET) coupled to an anode of the diode; and a comparator coupled to a gate of the FET, the comparator configured to receive as inputs: a) a signal representative of an input voltage (VDRV) applied to the FET; b) a ground; c) a boot signal representative of a Voltage at the anode of the capacitor (Boot); and d) a signal representative of a Voltage at the source of the first GaN FET. The BCC controller is configured to compare: a) a difference of: i) the VDRV and the GND, to generate a first comparison signal, to b) a difference of ii) the Boot and the source of the GaN FET, to generate a second comparison signal; wherein the BCC controller is further configured to maintain a relationship between the first comparison signal and the second comparison signal base on the comparison, and wherein the BCC controller is further configured to drive a gate output signal to the GaN FET to the maintain this relationship.

A second aspect provides a system, comprising: a) a GaN FET; b) a bootstrap capacitor clamp (BCC) controller coupled to a gate of the GaN FET. The BCC controller comprises: a comparator; a FET, a gate of which is coupled to an output of the comparator. The BCC controller further comprises a first isolation switch coupled to a positive input of the comparator, a drain of the first isolation switch coupled between a first resistor and a second resistor, wherein the first resistor is also coupled to an anode of a capacitor, and wherein the second resistor is coupled to a ground; and a second isolation switch coupled to a negative input of the comparator, a drain of the second isolation switch coupled between a third resistor and a fourth resistor, wherein the third resistor is also coupled to a signal representative of a signal voltage (VDRV) and wherein the fourth resistor is also coupled to a source of the GaN FET.

A third aspect provides a system comprising: A system, comprising: a first gallium nitride field effect transistor (GaN FET); a first driver coupled to a gate of the first GaN FET; an anode of a capacitor coupled to an output of the driver and a source of the GaN FET; a diode having a cathode coupled to the cathode of the capacitor; and a bootstrap capacitor clamp (BCC) controller. In the third aspect, the BCC controller includes a field effect transistor (FET) coupled to an anode of the diode; and a comparator coupled to a gate of the FET, the comparator configured to receive as inputs: a) a signal representative of an input voltage (VDRV) applied to the source of the FET; b) a ground; c) a boot signal representative of a voltage at the anode of the capacitor; and d) a signal representative of a voltage at the source of the first GaN FET. In the third aspect, the bootstrap capacitor clamp is configured to compare: a) a difference of: i) the VDRV and the GND to generate a first comparison signal; to b) a difference of ii) the Boot and the SW to generate a second comparison signal; wherein the BCC controller is configured to maintain a relationship between the first comparison signal and the second comparison signal base on the comparison, and wherein the BCC controller is further configured to drive a gate output signal to the drain of a second GaN FET coupled to a source of the first GaN FET; an inductor coupled to a source of the first GaN FET; and a drain of a second GaN FET coupled to a source of the first GaN FET.

BRIEF DESCRIPTION OF THE DRAWINGS

Reference is now made to the following descriptions.

DETAILED DESCRIPTION

Figure 1:
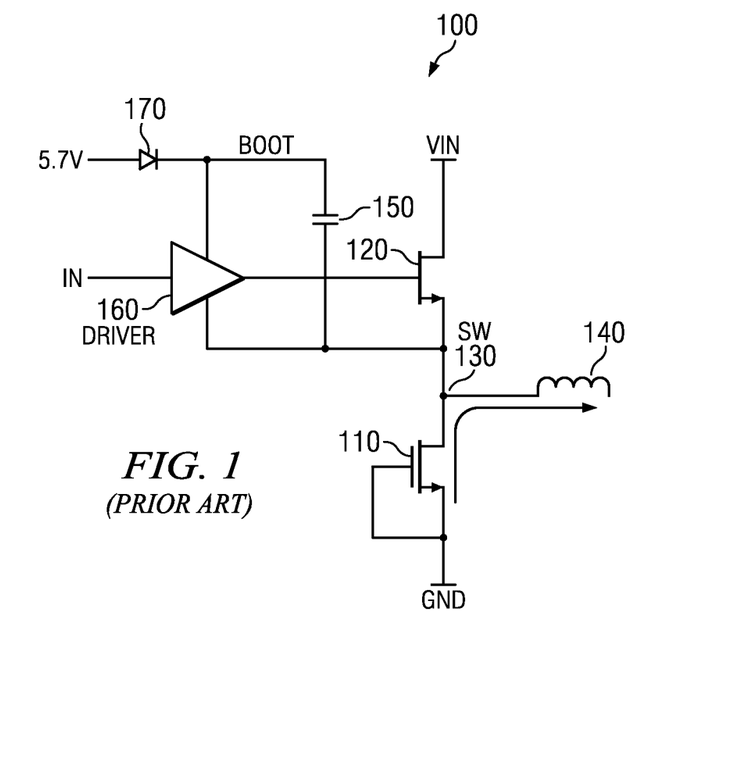
FIG. 1 illustrates a prior art half bridge power stage that employs both a low side MOSFET and a high side GaN FET.

Turning to FIG. 1, illustrated is a prior art half bridge power stage 100 that employs both a low-side MOSFET 110 and a high-side GaN FET 120. A (SW) switch node 130 of the power stage 100 is coupled to both a source of the GaN FET 120 and a drain of the MOSFET 110. An inductor 140 is coupled to the SW node 130. A VIN is coupled to a drain of the GaN FET 120, and a GND is coupled to both the source and the gate of the MOSFET 110. In FIG. 1, MOSFET 110 is a negative channel FET (NFET).

This ensures that the NFET 110 can conduct drain to source when SW node 130 is more than one Voltage drop above GND through its body diode (not illustrated). However, NFET 110 will not conduct when SW node 130 is greater than GND, as the low side NFET 110 intrinsic body diode is oriented drain to source, so it will not conduct.

An anode of a boot capacitor 150 is coupled to the SW node 130. An output of a driver 160 is coupled to the gate of the GaN FET 120, with the negative rail of the driver 160 also coupled to the SW node 130. A positive rail of the driver 160 is coupled to a cathode of the b capacitor 150. A cathode of a high voltage diode 170, e.g., from 50V to 600V handling capacity, is coupled to the cathode of the capacitor 150. A source reference voltage, such as 5.7 Volts, is coupled to the anode of the high voltage diode 170.

In the circuit 100, the VIN Voltage is used as an upper rail for the SW node 130, and the 5.7V is used as VDR. Generally, in the circuit 100, bootstrapping is to provide the gate of NMOS 120 with a voltage higher than VIN. VDR is charged into the capacitor, and then is booted up to provide VDR+VIN to the gate of high side FET 120. For more information on bootstrapping, please see *Application Note AN-6076: Design and Application Guide of Bootstrap Circuit for High-Voltage Gate-Drive IC.*" By Fairchild Corporation, Rev 1.0.0, Copyright 2008, which is incorporated by reference in its entirety.

Regarding FIG. 1A, a half bridge power stage such as the half bridge power stage 100, can be used with a number of power circuits, such as a buck circuit, a boost circuit, and isolated buck circuit. However, in a current limit condition, i.e., when a controller detects a high current is passing through the system and brings half-bridge to a "Tri-state" or similar fault condition, a half-bridge can go to a tri-state and, if there is still current in the conductor going out of the half bridge 100, current is drawn from the low side NFET 110. This can be through the intrinsic body diode of the NFET 110. For more information on "tri-state", please see Wikipedia, The Free Encyclopedia, "Three-stage logic", as of Feb. 2, 2012, which is incorporated by reference in its entirety However, there are problems associated with a "mixed" system, such as the half bridge power stage 100 of FIG. 1, which employs both a low-side MOSFET 110 and a high-side GaN FET 120. For example, the NFET 110 constrains operating characteristics of the half bridge power stage 100 due to such factors of its higher $rds_{on}$ when compared to the GaN FET 120 at a same operating frequency, thereby not availing the operation of a half bridge circuit 100 to many of the various advantages of employment of GaN FET technologies.

Generally, as is understood by the present inventor, one problem with mixed design is that not all of possible benefits of GaN can be used. In other words, switching losses happen on both FETs. If only one FET with GaN in a system operating at high frequency, this is inefficient. Moreover, there are significant integration issues.

Figure 2:
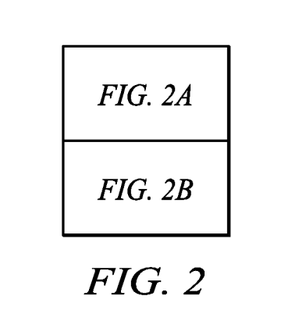
FIG. 2 illustrates a prior art GaN FET driver system that employs transformers.
Figure 2A:
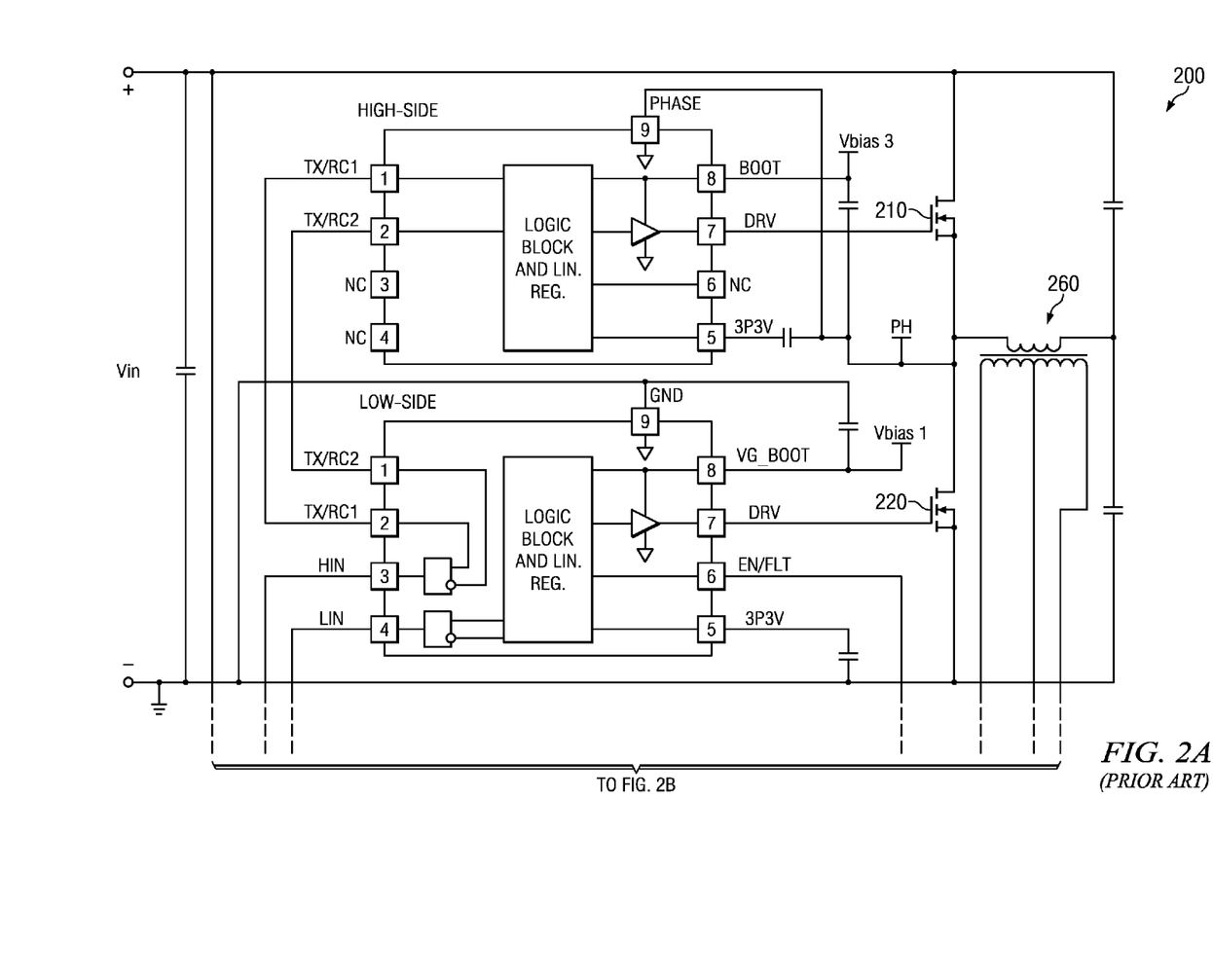
Figure 2B:
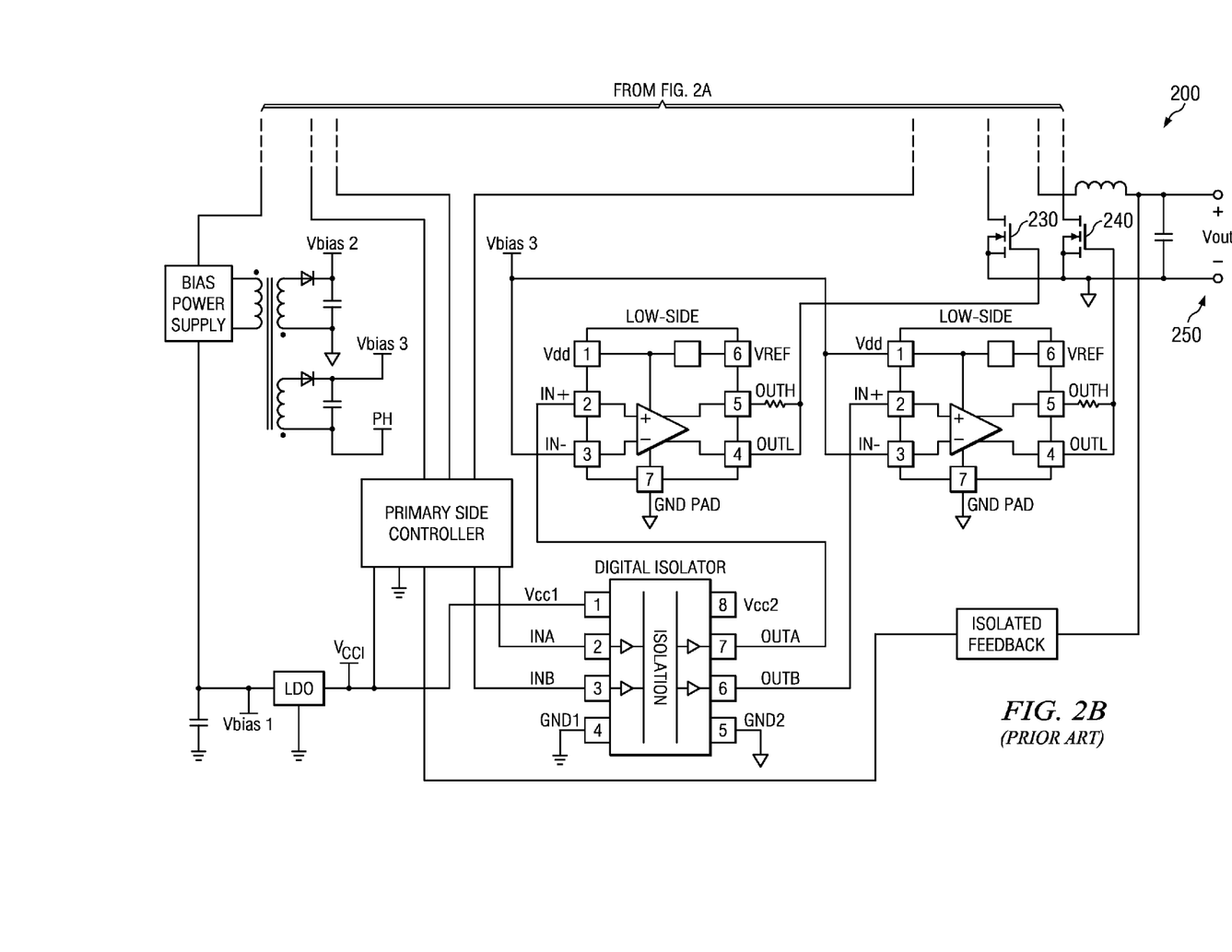

FIG. 2 illustrates a prior art floating transformer system 200 that employs GaN FETs 210, 220, 230, 240, to drive an output Voltage across a capacitor 250. However, the transformer system 200 employs a transformer 260 to help achieve these ends. Transformers are typically large, bulky, expensive, can not typically be integrated within an integrated circuit, and tend to have significant variability in performance parameters.

Figure 3:
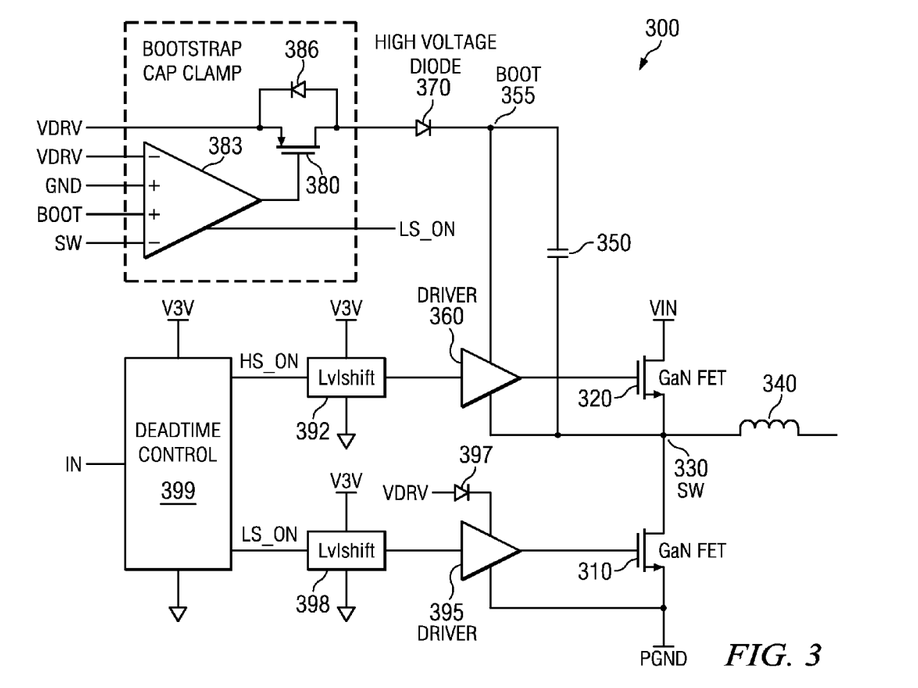
FIG. 3 illustrates an example of a half bridge power stage that employs both low side and high side GaN FETs with driver circuitry constructed according to principles of the present Application.

FIG. 3 illustrates an example of a half bridge power stage 300 that employs both a low side GaN FET 310 and a high side GaN FETs 320 with driver circuitry, including a bootstrap capacitor clamp (BCC) controller 380.

A SW node 330 of the power stage 300 is coupled to both a source of the GaN FET 320 and a drain of the GaN FET 310. An inductor 340 is coupled to the SW node 330. A VIN is coupled to a drain of the GaN FET 320, and a GND is coupled to both the source of the GaN FET 110.

An anode of a boot capacitor 350 is coupled to the SW node 330. An output of a driver 360 is coupled to the gate of the GaN FET 320, with the negative rail of a high-side driver 360 also coupled to the SW node 330. A positive rail of the high-side driver 360 is coupled to a cathode of the capacitor 150. A cathode of a high voltage diode 370 is coupled to the cathode of the capacitor 350.

In the half bridge power stage 300, a bootstrap capacitor clamp (BCC) controller 380 is coupled to an anode of the diode 370 at a boot node 355. The BCC controller 380 includes both a comparator 383 and a MOSFET 386, such as a PFET. The drain of the MOSFET 386 receives a reference Voltage VDRV at its source. Generally, VDRV can be regarded as an "ideal" high voltage rail (minus the drop across diode 370) for the driver 360, and hence the gate of the high side GaN FET 320.

The BCC controller 380 includes at the input of the comparator 383 the VDRV, the GND, a signal from boot node 355, and a signal from the SW node 330. An output of the comparator 383 is coupled to a gate of the MOSFET 386. The BCC controller 380 also employs the LS_ON signal, as will be explained in further detail regarding FIG. 4.

The half bridge power stage 300 further includes a voltage level shifter (VLS) 392 coupled to an input of the driver 360 and a VLS 398 coupled to an input of a low-side driver 395. An output of the low-side driver 395 is coupled to a gate of the low-side GaN FET 310. A high voltage rail of the low-side driver 395 is coupled to VDRV through a high voltage diode 397, and a low voltage rail of the low-side driver 395 is coupled to GND. In some approaches, PGND and GND are connected on single points to minimize switching noise effects.

In the circuit 300, a deadtime control circuit 399 drives the driver 360 when the high side GaN FET 320 is to be on through a HS_ON signal, and the driver 395 when the low side GaN FET 320 is to be on through an LS_ON signal.

In the half bridge power stage 300, the VIN voltage is used as an upper voltage range of the SW node 330, and the BCC 380 is used to power up the boot capacitor 150. Generally, regarding employment of the low side GaN FETs, instead of a low side MOSFET of circuit 100, there is no body diode within the GaN FET to conduct current. In a current limit condition or similar fault condition, a half-bridge can go to a tri-state, if there is still current in the inductor going out of the half bridge, current would be drawn from a low side GaN FET.

However, this creates problems in prior art configurations because an enhancement mode (EM) GaN FET has no body diode, and an EM GaN FET would start conducting source to drain when the drain, coupled to SW node, is at −3 Volts or −4 Volts, depending upon the current. During this time of this voltage, which can be several switching periods of half bridge and full bridge that can take as much as few hundreds of milliseconds.

Generally, a bootstrap capacitor is charged to the difference of drive voltage VD and most negative voltage the switch pin sees during low-side FET off period. For example for driver voltage of 5 volts and a SW node that can go to −3V in GaN case, the bootstrap capacitor is charge to 5−(−3V)=8V. In next cycle the bootstrap capacitor voltage is used to turn on the high-side GaN FET stressing it with 8V, which can damage the device. Therefore, a voltage drop across the GaN FET from drain to source under discussion is 8 volts.

Even more problematically, however, is that, when a high side driver of a prior art configuration receives a high side on (HS_ON) signal, the high side GaN FET is driven to the upper rail, which is the voltage of the cathode of the bootstrap capacitor, such as can be 5 Volts. However, the SW node is at perhaps −3 Volts or −4 Volts, which means that 8 or 9 Volts are being applied as Vgs across the high side GaN FET, in excess of the GaN FET ability to handle without significant reliability issues occurring within the high side GaN FET. These problems can include an increased $rds_{on}$ resistance, shorted life of the GaN FET, perhaps causing the GaN FET to cease to function entirely.

The circuit 300 addresses at least some of these disadvantages, and advantageously measures a low voltage limit of the SW node 330, thereby avoiding high side GaN FET 320 gate source voltage overdriving. In on aspect, the BCC controller 380 is configured to keep a voltage difference between a first input voltage of the amplifier 385 and a second input of the amplifier 385 substantially constant.

Generally, the BCC controller 380 senses the voltage of the VDRV, the GND, the boot node 355, and the SW node 330, and turns off the MOSFET 386 if a certain threshold is reached, or a relationship is reached, among the VDRV, the GDN, the SW node 330, and the boot node 355. In one example implementation, the comparator 383 within the BCC controller 380 turns of the MOSFET 380 if the voltage of the boot node 355 minus voltage at SW node 330 is greater than the VDRV voltage minus the GND voltage. This helps to prevent overcharging of a voltage difference between the boot node 355 and the SW node 330, or in other words, between the gate of the high side GaN FET 320 and the source of the high side GaN FET 320, thereby mitigating or even avoiding completely problems with Vgs GaN FET 320 overcharging.

In one example usage of the half bridge power stage 300, if an overcurrent condition, or other condition, starts to occur, and the SW node 330 starts to drop voltage, and otherwise the low side GaN FET 310 starts to drop, reaching or approaching the −3 or −4 reverse conduction voltage at the SW node 330, the BCC controllers 380 opens the MOSFET 386, which allows the voltage at capacitor to 350 to float with the drop of voltage at the SW node 330, so as SW node 330 drops, so does the upper rail of the upper driver 360, as the upper drive 360 upper rail is coupled to the boot node 355. As the upper rail of the upper driver 360 drops, so does the driven gate voltage of the upper side GaN FET 360.

Therefore, the drive voltage of the gate of the GaN FET 320 does not exceed the specified relationship, such as boot node 355 voltage minus the SW node 330 voltage, thereby mitigating or even avoiding completely problems with Vgs GaN FET 320 overcharging.

Employment of the BCC controller 380 in conjunction with the boot capacitor 350, offers a number of advantages over various prior art approaches, such at the floating transformer system 200 of FIG. 2 or use of a zener diode directly between the gate and source of a high side GaN FET instead of bootstrapping to create a high side drive.

In the half bridge controller 300, the implementation can be lower cost compared to the diode, especially for low voltage to medium voltage range (e.g. medium range: 60 Volt-100 Volts) implementations. Moreover, employment of the BCC controller 380 in conjunction with the boot capacitor 350 enables a generate a wide choices of "protection" (i.e. Vgs) voltages for the high side GaN FET 320 rather than having to design around the various intrinsic reverse bias voltages of various zener diodes), and is more power efficient, since the BCC controller 380 turns of its FET 386 to prevent overcharging of the Vgs of the high side of the GaN FET 320, whereas the zener is always consuming power and more, may cause a low side driver of a low side GaN FET to go to current limit.

Moreover, in high voltage applications with VIN of 60 to 100V, a local supply supplies 5-10V to drive the gates of transistors (a 60/100V transistors has a $V_{dsmax}$ of 60/100, but $V_{gsmax}$ is 5-10V), therefore a low dropout (LDO) or a buck regulator is typically employed to create 5-10V. Usually, the drive requirements are few tens of milliamps, and LDO or buck that is needed are very small bucks with max current limit of 50-100 mA. However, if a clamp capacitor were to be employed with prior art MOSFET circuitry, it may cause more current than LDO/buck current limit to come from these circuits and causing their output voltage to drop.

Advantageously, the half bridge controller 300 and BCC controller 380 can be embodied within a single integrated circuit, which can lead to lower cost, and smaller area.

Figure 4:
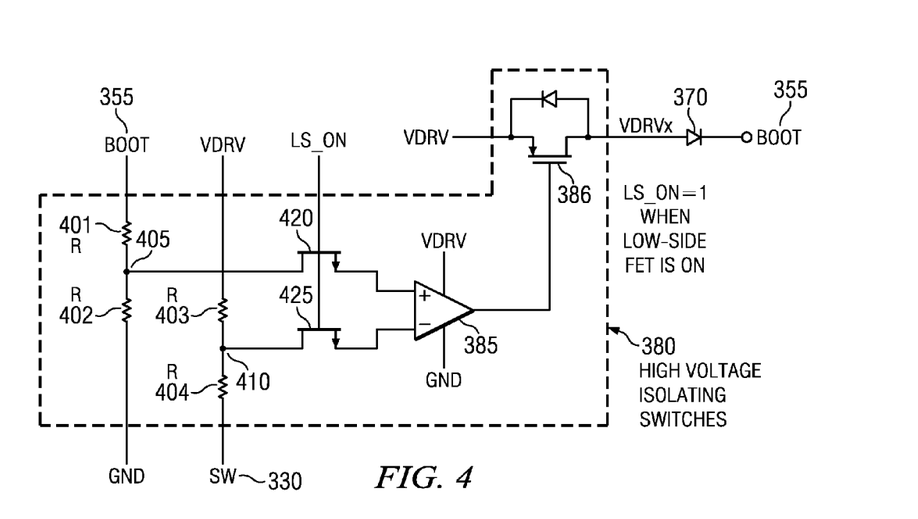
FIG. 4 is an example of a bootstrap capacitor clamp (BCC) controller for a GaN FET, such as employable with the half bridge power amplifier of FIG. 3.

FIG. 4 illustrates the BCC 380 controller in more detail. Within the BCC controller 380, a first resistor 401 is coupled to the boot node 355. The first resistor 401 is also coupled to a second resistor 402 at a node 405, and the second resistor 402 is coupled to GND. Within the BCC controller 380, a third resistor 403 is coupled to the VDRV. The third resistor 403 is also coupled to a fourth resistor 404 at a node 410, and the fourth resistor 410 is coupled to the SW node 330.

The node 405 and the node 410 are coupled to a high voltage isolating switch 420, 425, respectively, wherein high voltage MOS switches to cascade low voltage circuits against high voltages seen in SW and BOOT pins. The first and second isolating switches 420, 425 are coupled into the positive and negative inputs of the comparator 383. The output of the comparator 383 is coupled to the MOSFET 386. In the illustrated example, the switches 420, 425 are driven on when LS_ON signal is received at these switches to create a first comparison signal and a second comparison signal, respectively.

The BCC controller 380 can work as follows.

Depending upon the proportion of values of R 401 and 402, which compares Boot voltage and Ground voltage, a weighted average between these two is generated to generate a weighted value proportional to a target boot voltage, hypothetical voltage being applied to the gate of the high side GaN FET 320. Depending upon the proportion of values of R 403 and 404, which compares VDRV voltage and SW voltage, a weighted average between these two is generated to generate a weighted value proportional to an upper range VDRV target voltage, voltage being applied to the gate of the GaN FET 320.

Within the comparator 383, if the boot node is slightly lower than the VDRV node, but the GND and SW are the same, then the comparator 383 applies a negative or ground voltage to the gate of the MOSFET 386, which in the illustrated aspect is a PFET. Therefore, the PFET would on, as the Vgs would meet the threshold values. However, if the boot node becomes higher than the ground, then the comparator 383 turns off the MOSFET 386, as it would be a positive signal applied to a gate of a PFET, thereby allowing the boot node 355 voltage to float, protecting the gate of the high side GaN FET 320. In the BCC controller 380, both the VDRV and the GND are substantially fixed, so as the boot voltage goes up, the MOSFET 386 is turned off. Moreover, as the SW node 330 voltage goes down past its set point, the MOSFET 386 is also turned off. This in turn protects the Vgs of the high side GaN FET 320 of FIG. 3 through allowing boot node 355 to float.

In a further aspect, the isolating switches 420, 425 are employed. These isolating switches are enabled when the LS_ON signal is received from the deadtime control 399 of FIG. 3. Therefore, the comparator 383 of the BCC 380 only changes its outputs when the LS_ON signal is received as a high. When the LS_ON signal is not high, the isolation switches 420, 425 continue to output their last values.

However, in this aspect, even should the MOSFET 386 be on and VDRV is applied to the high voltage diode 370, and hence the boot 355, minus the voltage drop across the high voltage diode 370, this is not problematic, as the deadtime control 399 command the driver 360 to output a low signal to the gate of the GaN FET 320, thereby helping to ensure that the Vgs of the GaN FET 320 is nonetheless within tolerance parameters.

Figure 5:
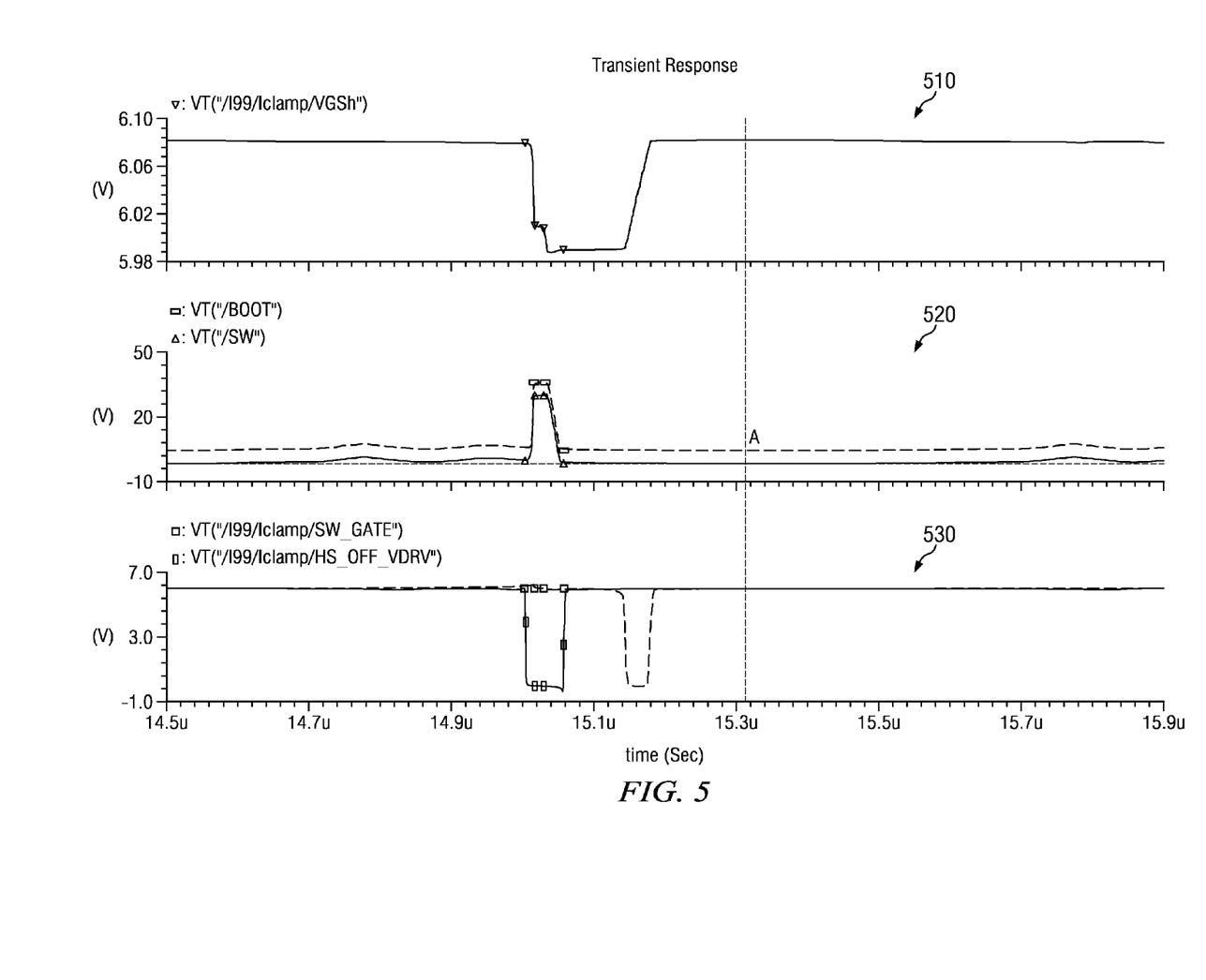
FIG. 5 is an illustration of a transient input voltage, and various resulting voltages across at different nodes of the half-bridge power stage that employs both low side and high side GaN FETs with driver circuitry of FIG. 3 and the BCV circuitry of FIG. 4.

FIG. 5 illustrates three graphs 510, 520, 530 of simulations of simultaneous voltages various nodes of the circuit 300 under various conditions.

In FIG. 5, 510 is the voltage across boot capacitor 350. 520 shows SW and BOOT node of FIG. 3. A top graph of 530 is HS_OFF (equivalent to LS_ON); a bottom of graph 530 is gate of PFET 386.

In the illustrated example of FIG. 5, VDRV is set to about 6V. In this experiment; VSW can goes to −1.4V when high side FET is off (Low Side GaN FET 310 is always off in this example waveform, showing a fault condition). The 510 waveform shows boot capacitor 350 voltage discharges to turn on High side GaN FET 320 when HS_OFF becomes zero. When HS_OFF goes to "1" again, the gate of PMOS 396 goes to "zero" for 20 nanoseconds, allowing the boot capacitor 350 to charge to 6V VDRV-GND target. Once the boot capacitor 350 is charged to 6V, PMOS 380 turns off and prevents overcharging to 7.5V that could occur if the circuit 300, or other circuits employing the principles of the present Application, were not used.

Those skilled in the art to which this Application relates will appreciate that other and further additions, deletions, substitutions and modifications may be made to the described embodiments.

What is claimed is:

1. An apparatus, comprising:
   a first gallium nitride field effect transistor (GaN FET);
   a first driver coupled to a gate of the first GaN FET;
   an anode of a capacitor coupled to an output of a driver and a source of the first GaN FET;
   a diode having a cathode coupled to the cathode of the capacitor; and
   a bootstrap capacitor clamp (BCC) controller, including:
      a field effect transistor (FET) coupled to an anode of the diode; and
   a comparator coupled to a gate of the FET, the comparator configured to receive as inputs:
      a) a signal representative of an input voltage (VDRV) applied to the FET;
      b) a ground;
      c) a boot signal representative of a voltage at the anode of the capacitor (Boot); and
      d) a signal representative of a Voltage at the source of the first GaN FET,
   wherein the BCC controller is configured to compare:
      a) a difference of: i) the VDRV and the GND, to generate a first comparison signal, to
      b) a difference of ii) the Boot and the source of the first GaN FET, to generate a second comparison signal;
   wherein the BCC controller is further configured to maintain a relationship between the first comparison signal and the second comparison signal base on the comparison, and
   wherein the BCC controller is further configured to drive a gate output signal to the first GaN FET to maintain this relationship.

2. The apparatus of claim 1, wherein the drain of the FET is coupled to the anode of the diode.

3. The apparatus of claim 1, wherein the apparatus, further comprising a drain of a second GaN FET coupled to a source of the first GaN FET, and the first GaN FET is a high side GaN FET, and the second GaN FET is a low side GaN FET.

4. The apparatus of claim 3, wherein an inductor is coupled to the source of the first GaN FET.

5. The apparatus of claim 4, wherein said apparatus includes in a half bridge voltage rectifier.

6. The apparatus of claim 1, wherein the relationship is a substantially equal voltage drop comparison between: i) the VDRV and the GND, and ii) the Boot and the source of the GaN FET.

7. The apparatus of claim 1, wherein the driver is a first driver, and a deadtime control is coupled to an input of the first driver and a second driver, wherein the second driver is also coupled to a gate of a second GaN FET, the second GaN FET coupled to the source of the first GaN FET.

8. The apparatus of claim 1, further comprising an upper driver rail of the first driver coupled to a cathode of the capacitor; and a lower rail of the first driver coupled to the source of the first GaN FET.

9. A system, comprising:
   a) a GaN FET;
   b) a bootstrap capacitor clamp (BCC) controller coupled to a source of the GaN FET, the BCC controller comprising:
   a comparator;
   a FET, a gate of which is coupled to an output of the comparator;
   a first isolation switch coupled to a positive input of the comparator, a drain of the first isolation switch coupled between a first resistor and a second resistor, wherein the first resistor is also coupled to an anode of a capacitor, and wherein the second resistor is coupled to a ground;

a second isolation switch coupled to a negative input of the comparator, a drain of the second isolation switch coupled between a third resistor and a fourth resistor, wherein the third resistor is also coupled to a signal representative of a signal voltage (VDRV) and wherein the fourth resistor is also coupled to the source of the GaN FET.

10. The system of claim 9, wherein the first isolation switch and the second isolation switch are enabled when receiving a low side GaN FET on (LS_ON) signal.

11. The system of claim 10, wherein the comparator turns on the FET when a difference between the voltage at the anode of the capacitor and GND voltage is greater than that of a difference between the VDRV and the voltage at the source of the GaN FET.

12. The system of claim 9, further comprising a diode coupled between the BCC controller and a cathode of the capacitor.

13. The system of claim 12, further comprising the capacitor coupled between the diode and the source of the GaN FET.

14. The system of claim 9, wherein driving the FET off by the comparator allows a voltage across the capacitor to float, thereby not overdriving a difference between a gate and the source of the GaN FET.

15. The system of claim 9, wherein the BCC controller is configured to keep a voltage difference between the positive input of the comparator and the negative input of the comparator substantially constant.

16. The system of claim 11, wherein said system is embodied upon an integrated circuit.

17. A system, comprising:
a first gallium nitride field effect transistor (GaN FET);
a first driver coupled to a gate of the first GaN FET;
an anode of a capacitor coupled to an output of a driver and a source of the first GaN FET;
a diode having a cathode coupled to the cathode of the capacitor; and
a bootstrap capacitor clamp (BCC) controller, including:
  a field effect transistor (FET) coupled to an anode of the diode; and
  a comparator coupled to a gate of the FET, the comparator configured to receive as inputs:
    a) a signal representative of an input voltage (VDRV) applied to the source of the FET;
    b) a ground;
    c) a boot signal representative of a voltage at the anode of the capacitor; and
    d) a signal representative of a voltage at the source of the first GaN FET, wherein the bootstrap capacitor clamp is configured to compare:
      a) a difference of: i) the VDRV and the GND to generate a first comparison signal; to
      b) a difference of ii) the Boot and the voltage at the source of the first GaN FET to generate a second comparison signal;
    wherein the BCC controller is configured to maintain a relationship
    between the first comparison signal and the second comparison signal base on the comparison, and
      wherein the BCC controller is further configured to drive a gate output signal to the a drain of a second GaN FET coupled to the source of the first GaN FET;
  an inductor coupled to the source of the first GaN FET; and
  a drain of the second GaN FET coupled to a source of the first GaN FET.

18. The system of claim 17, wherein the BCC controller further comprises:
a first isolation switch coupled to a positive input of the comparator, a drain of the first isolation switch coupled between a first resistor and a second resistor, wherein the first resistor is also coupled to an anode of the capacitor, and wherein the second resistor is coupled to a ground;
a second isolation switch coupled to a negative input of the comparator, a drain of the second isolation switch coupled between a third resistor and a fourth resistor, wherein the third resistor is also coupled to a signal representative of a signal voltage (VDRV) and wherein the fourth resistor is also coupled to the source of the first GaN FET.

19. The system of claim 18, wherein driving the FET off by the comparator allows a voltage across the capacitor to float, thereby not overdriving a difference between the gate and the source of the first GaN FET.

20. The system of claim 18, wherein the BCC controller is configured to keep a voltage difference between the positive input of the comparator and the negative input of the comparator substantially constant.

21. The system of claim 18, wherein said system includes in a half bridge voltage rectifier.

22. The system of claim 18, wherein the first GaN FET is a high side GaN FET, and the second GaN FET is a low side FET.

23. The system of claim 17, wherein said system is embodied upon an integrated circuit.

* * * * *